United States Patent
Bradl et al.

(10) Patent No.: US 6,337,255 B1
(45) Date of Patent: Jan. 8, 2002

(54) METHOD FOR FORMING A TRENCH STRUCTURE IN A SILICON SUBSTRATE

(75) Inventors: Stephan Bradl, Köfering; Olaf Heitzsch, Coswig; Michael Schmidt, Ottendorf-Okrilla, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/535,648

(22) Filed: Mar. 24, 2000

Related U.S. Application Data

(63) Continuation of application No. PCT/DE98/02832, filed on Sep. 22, 1998.

(30) Foreign Application Priority Data

Sep. 24, 1997 (DE) .......................... 197 42 174

(51) Int. Cl.[7] ......................... H01L 21/76; H01L 21/302
(52) U.S. Cl. ...................... 438/424; 438/427; 438/723; 438/789; 438/969
(58) Field of Search ................................ 438/424, 427, 438/296, 926, 435, 437, 723, 738, 740, 789, 692, 431, 959

(56) References Cited

U.S. PATENT DOCUMENTS

| | | | |
|---|---|---|---|
| 4,226,665 A | | 10/1980 | Mogab |
| 4,671,970 A | | 6/1987 | Keiser et al. |
| 5,294,294 A | | 3/1994 | Namose |
| 5,817,567 A | * | 10/1998 | Jang et al. .................. 438/427 |
| 5,874,345 A | * | 2/1999 | Coronel et al. ............. 438/427 |
| 6,004,863 A | * | 12/1999 | Jang ............................ 438/427 |
| 6,071,817 A | * | 6/2000 | Aliman et al. .............. 438/692 |
| 6,100,163 A | * | 8/2000 | Jang et al. .................. 438/437 |
| 6,207,532 B1 | * | 3/2001 | Lin et al. .................... 438/424 |
| 6,261,923 B1 | * | 7/2001 | Kou et al. ................... 438/424 |
| 6,277,707 B1 | * | 8/2001 | Lee et al. .................... 438/430 |

FOREIGN PATENT DOCUMENTS

| | | |
|---|---|---|
| EP | 0 341 898 | 11/1989 |
| GB | 2 306 050 A | 4/1997 |

OTHER PUBLICATIONS

Wolf, Stanley "Silicon Processing for the VLSI Era vol. 1: Process Technology", Lattice Press, 1986, pp. 175–182, 191–195.*

"Method for planarizing over shallow trenches filled with silicon dioxide", dated Feb. 1990, IBM Technical Disclosure Bulletin, vol. 32, No. 9A, pp. 439 and 440.

* cited by examiner

*Primary Examiner*—Michael S. Lebentritt
(74) *Attorney, Agent, or Firm*—Herbert L. Lerner; Laurence A. Greenberg; Werner H. Stemer

(57) ABSTRACT

A method for forming a trench structure in a silicon substrate, which trench structure serves for electrically insulating a first region of the substrate from a second substrate region. The method proceeds from a growth of a thermal oxide layer on the substrate surface and an application and patterning of a mask layer over the thermal oxide layer. A trench of predetermined depth is subsequently etched into the silicon substrate through the patterned mask layer. The trench is filled by a deposition of a conformal covering oxide layer on the substrate with an essentially uniform thickness that is sufficient for completely filling the trench. Afterwards, a polysilicon layer is deposited on the covering oxide layer and a chemical mechanical planarization method is carried out with high selectivity S between the polysilicon material and the oxide material in order to obtain a flat surface. In a further method step, the layer is additionally removed by an essentially nonselective, joint etching of the polysilicon material and of the oxide material while maintaining a planar surface produced in the preceding planarization step. The etching operation is carried out at least until all the polysilicon material has been removed in a region of the trench.

10 Claims, 4 Drawing Sheets

METHOD FOR FORMING A TRENCH STRUCTURE IN A SILICON SUBSTRATE

CROSS-REFERENCE TO RELATED APPLICATION

This is a continuation of copending international application PCT/DE98/02832, filed Sep. 22, 1998, which designated the United States.

BACKGROUND OF THE INVENTION

Field of the Invention

The invention relates to a method for forming a trench structure in a silicon substrate. The trench structure electrically insulates a first region of the substrate from a second region of the substrate.

As a result of the rising integration level in semiconductor components, the requirements made of the electrical insulation of adjacent active regions on a semiconductor substrate are continuously becoming more and more stringent. In the case of the local oxidation of silicon (LOCOS) technique currently used to fabricate integrated circuits on a large scale, the electrical insulation of adjacent MOS transistors is achieved by the localized formation of a field oxide. In this method, a so-called bird's beak is formed in the transition region between the field oxide and the gate oxide. The bird's beak has the disadvantage that, on account of its lateral extent, it reduces the semiconductor substrate area t is available for active regions, and thus leads to significant difficulties in the case of structures in the region of 0.35 $\mu$m or less.

The trench isolation technique including shallow trench isolation (STI) has been proposed as an alternative to the LOCUS technique. In the case of the trench isolation technique, narrow trenches are etched into the monocrystalline silicon substrate and subsequently filled with an insulating material. The filled trenches then act as space-saving electrical insulation barriers between active regions. This technique is highly suitable for the electrical insulation both of closely adjacent bipolar transistors and of p-channel and n-channel MOS transistors in CMOS circuits. What is disadvantageous, however, is that the use of this technique necessitates a high process complexity and is therefore associated with high costs.

The high process complexity can essentially be attributed to the fact that after the trench has been filled with silicon dioxide, the trench profile is transferred to the silicon dioxide layer and, therefore, a further, leveling layer, for example a photoresist or a polysilicon layer, has to be applied to the silicon dioxide layer, which gives rise to evenness problems on account of the different layer materials in the course of the subsequent planar removal of the layer. These then have to be compensated for by additional processes in order to obtain a planar substrate surface again after the removal of the silicon dioxide layer.

SUMMARY OF THE INVENTION

It is accordingly an object of the invention to provide a method for forming a trench structure in a silicon substrate which overcomes the above-mentioned disadvantages of the prior art methods of this general type, which enables a trench structure to be fabricated in a silicon substrate in the simplest and most cost-effective manner possible.

With the foregoing and other objects in view there is provided, in accordance with the invention, a method for forming a trench structure in a silicon substrate, the trench structure electrically insulating a first region of the silicon substrate from a second region of the silicon substrate, the method which includes:

growing a thermal oxide layer on a surface of the silicon substrate;

applying and patterning a mask layer over the thermal oxide layer resulting in a patterned mask layer;

etching a trench using the patterned mask layer down to a predetermined depth into the silicon substrate;

depositing a substantially conformal covering oxide layer with substantially uniform thickness that is sufficient for completely filling the trench;

depositing a polysilicon layer on the conformal covering oxide layer, a thickness of the polysilicon layer corresponding at least the predetermined depth of the trench;

chemical mechanical polishing of the polysilicon layer as far as a level of a surface of the conformal covering oxide layer with high selectivity between a polysilicon material of the polysilicon layer and an oxide material of the conformal covering oxide layer; and substantially nonselective, joint etching of the polysilicon material of the polysilicon layer and of the oxide material of the covering oxide layer while maintaining a planar surface produced in accordance with the chemical mechanical polishing step, the substantially nonselective etching step being carried out at least until all the polysilicon material of the polysilicon layer being removed in a region of the trench.

The effect achieved by the nonselectivity of the etching step is that the evenness produced in the preceding chemical mechanical polishing step (CMP: Chemical Mechanical Polishing) is preserved during the joint etching of the polysilicon material and the oxide material, until all the polysilicon material has been removed. This enables the joint removal of the polysilicon material and the oxide material by a single, cost-effective etching step. As a rule, a further polishing step is no longer required. Furthermore, the procedure also permits the setting of a defined oxide residual layer thickness over the silicon, provided that the thickness of the covering oxide layer deposited beforehand was larger than the depth of the trench by more than the desired residual layer thickness.

The nonselective etching step is preferably a plasma etching step, $NF_3/N_2/CHF_3$ gases preferably being used as etching gases.

In an advantageous manner, a selective etching step for removing the oxide material can be carried out after the nonselective etching step. This permits a predetermined distance between the surface of the silicon substrate and the surface of the trench oxide to be set by the etching of the oxide deposited in the trench. In addition, the selective etching step can be used for removing oxide material outside the trench.

In principle, the method according to the invention does not require the application of the silicon nitride layer to the thermal oxide layer, since the stopping effect of the silicon nitride layer which is utilized in a CMP step in the prior art is not required in this case. However, it may continue to be expedient for other reasons to provide the silicon nitride layer, for example in order to use it as a mask layer for the trench etching.

Other features which are considered as characteristic for the invention are set forth in the appended claims.

Although the invention is illustrated and described herein as embodied in a method for forming a trench structure in a silicon substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
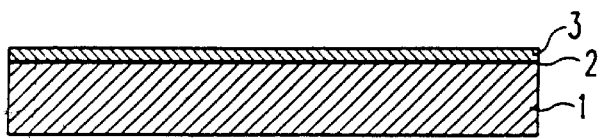
FIGS. 1a–1g are diagrammatic sectional views of a sequence of process steps of a specific method according to the prior art.
Figure 1B:
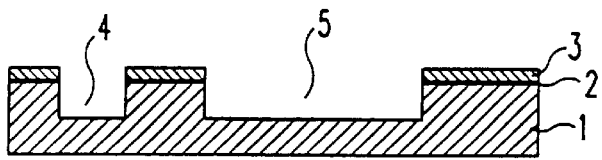
Figure 1C:
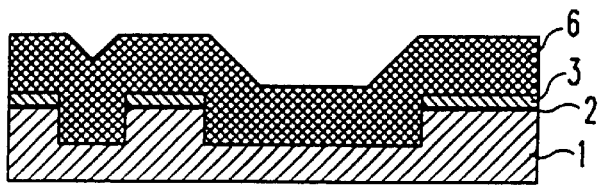
Figure 1D:
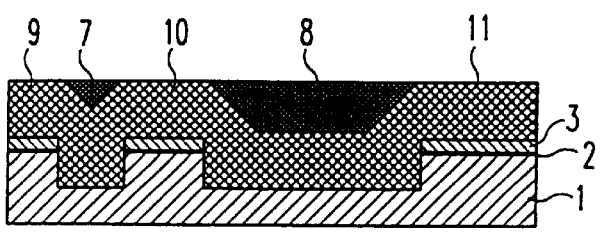
Figure 1E:
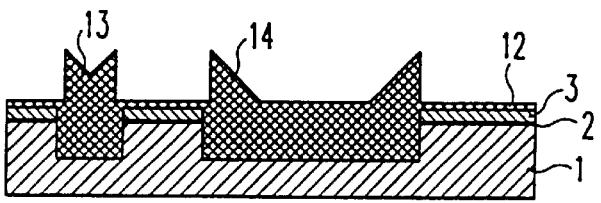
Figure 1F:
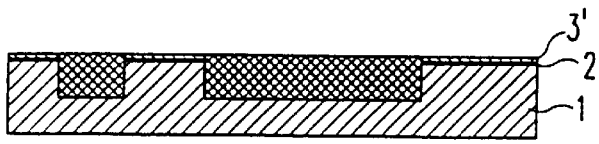
Figure 1G:
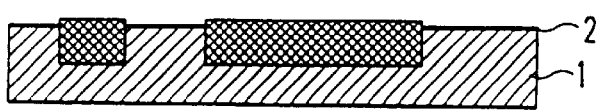

In all the figures of the drawing, sub-features and integral parts that correspond to one another bear the same reference symbol in each case. Referring now to the figures of the drawings in detail and first, particularly, to FIGS. 1a–1f thereof, there are shown process steps of a known method for producing a trench structure. First, a thin thermal oxide layer ($SiO_2$ layer) 2 and a thicker nitride layer ($Si_3N_4$) 3 lying over the latter are grown on a silicon substrate 1, see FIG. 1a. After patterning of the oxide and nitride layers 2, 3, trenches 4, 5 of a defined depth are introduced into the silicon substrate 1 by an etching process, see FIG. 1b. Afterwards, a non-illustrated intermediate oxide layer is grown on the entire substrate 1, and serves as a support for an undoped TEOS oxide layer 6 (TEOS: Tetraethyl orthosilicate) which is subsequently applied by a vapor phase deposition step, see FIG. 1c. Next, a deposition of undoped polysilicon on the TEOS oxide layer 6 and a subsequent chemical mechanical polishing operation (poly-CMP) in order to obtain a planar layer surface is performed. What remains of the polysilicon layer are polysilicon islands 7, 8 illustrated in FIG. 1d. The islands 7, 8 are used as masks in a subsequent plasma etching step, in order to etch away the unmasked TEOS layer regions 9, 10, 11 of the TEOS oxide layer 6 selectively to leave a residual oxide layer 12 above the nitride layer 3. The polysilicon islands 7, 8 are then removed from oxide structures 13, 14 of the TEOS oxide layer 6 that have remained by a further selective plasma etching step, see FIG. 1e. The oxide structures 13, 14 that have remained are subsequently planarized by a chemical mechanical polishing operation (oxide-CMP), in which the nitride layer 3 is used as a stop layer. In the course of the method, part of the nitride layer 3 is removed in order to ensure that any oxide has been completely removed from the nitride layer 3, in which case the nitride layer 3 must have a comparatively large thickness (approximately 150 nm) on account of its relatively weak stopping effect in the oxide-CMP process (selectivity ~1:4), see FIG. 1f. In a final step, a residual nitride layer 3' is then completely removed selectively by a further etching step, thereby uncovering the thin oxide layer 2 on the surface of the substrate 1, see FIG. 1g.

FIGS. 2a–2f show a first exemplary embodiment of the method according to the invention.

Figure 2A:
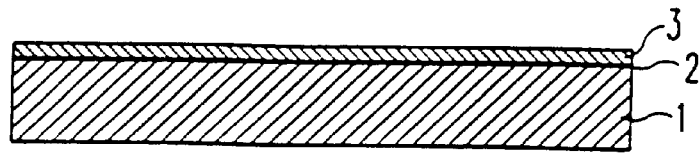
FIGS. 2a–2f are sectional views of a sequence of process steps that occur in a first exemplary embodiment of a method according to the invention.
Figure 2B:
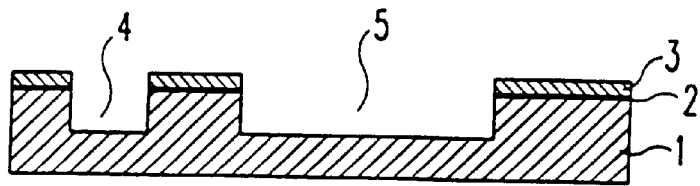
Figure 2C:
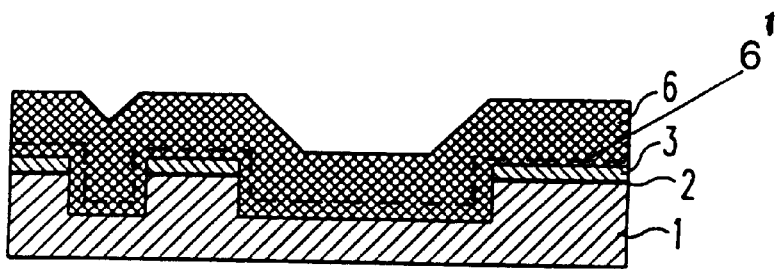
Figure 2D:
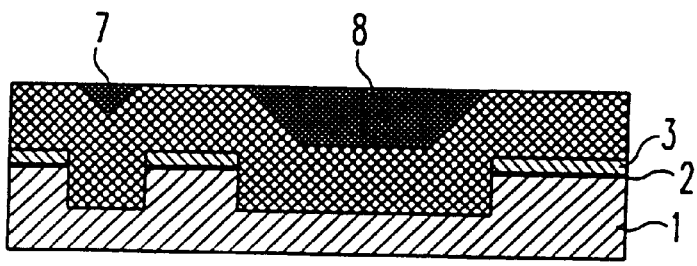

First, the silicon substrate 1 is provided with the thin thermal silicon dioxide layer 2 and the thicker nitride layer 3 lying above the latter, see FIG. 2a. Afterwards, in a manner that is not illustrated, the oxide layer 2, the nitride layer 3 and, if appropriate, also a further resist layer that is applied such that it lies above the latter and serves as a mask layer are patterned and plasma etching with a defined depth into the silicon substrate 1 is carried out, see FIG. 2b. The TEOS silicon dioxide layer 6 is subsequently applied in FIG. 2c, in which case, in accordance with the description relating to FIG. 1c, a thin intermediate oxide layer 6' (dashed lines) can be been applied beforehand, if appropriate. The deposited TEOS oxide layer 6 has an essentially conformal thickness, which results in that a layer thickness approximately corresponding to the layer thickness over unetched regions of the substrate 1 is achieved even in narrow trench regions. In this case, the topography produced by the trench etching is transferred upward.

The layer of undoped polysilicon is subsequently deposited on the TEOS oxide layer 6 and removed by chemical mechanical polishing of the polysilicon (poly-CMP) as far as the underlying TEOS oxide layer 6. The very good selectively of the poly-CMP process between polysilicon and silicon dioxide, which is about 100:1, is utilized in this case. For this reason, the polishing step stops exactly on the oxide and leaves behind a planar surface. All projecting polysilicon is removed, with the result that merely the polysilicon islands 7, 8 are left behind, see FIG. 2d.

In this example, the depth of the trenches 4, 5 in the substrate is approximately 400 nm and the thickness of the nitride layer 3 is approximately 150 nm, thereby resulting in a trench depth (defined as a distance between a trench bottom and a surface of the nitride layer 3) of approximately 550 nm. The thickness of the deposited TEOS oxide layer 6, measured over the unetched, active substrate regions, can be larger than the trench depth (for example approximately 120% of the trench depth), if an "overfill" of the trenches is desired. A TEOS oxide layer thickness corresponding to the trench depth is sufficient in principle, however, on account of the conformity of the deposited TEOS oxide layer 6.

A nonselective $NF_3/N_2/CHF_3$ plasma etching step with virtually identical etching rates for oxide and polysilicon is subsequently carried out in the present exemplary embodiment. In the example under consideration here, the etching operation is carried out with a high-frequency power of 800 watts without an additional magnetic field, and at a temperature of 20° C. The receptacle pressure is approximately 6 Pa and an etching gas having a composition (details in % by volume) of 89.5% $N_2$; 2.6% $CHF_3$ and 7.9% $NF_3$ is used, a selectivity between oxide and polysilicon of 1.04:1 being achieved.

The invention is not restricted to a plasma etching step, rather any desired etching method can be employed as long as it has a sufficiently low selectivity to ensure that a planar is surface is preserved in the course of the layer removal. Other constituents and compositions of the etching gas to be used are also possible.

Figure 2E:
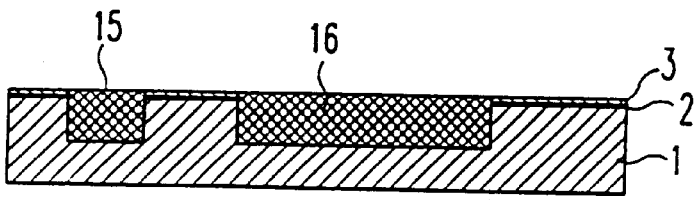

The nonselective etching step can be carried out with a duration lasting exactly until all the oxide material has been removed above the nitride layer 3 and a common planar oxide/nitride surface 15, 16, 3 is present above the substrate 1—as shown in FIG. 2e. On the other hand, it is also possible, in a manner that is not illustrated, to terminate the nonselective etching step actually before the nitride layer 3 is reached, provided that the polysilicon islands 7, 8 have already been completely removed above the nitride layer 3. In this case, it is possible to establish a residual oxide layer with a planar surface and a defined thickness over the active regions of the silicon substrate 1.

A further variant consists in employing a selective etching step for removing the oxide after the nonselective plasma etching step. The selective etching step enables, on the one hand, the removal of the above-mentioned residual oxide layer that may be present above the silicon substrate 1 and, on the other hand, more extensive, selective etching of the trench oxide 15, 16 in order to set a defined distance between a surface 17 of the substrate 1 in unetched regions and the surfaces 18, 19 of the trench oxide 15, 16. A wet etching step is particularly suitable for this purpose on account of the good selectivity, the minor damage to the etched surface and the high uniformity.

Figure 2F:
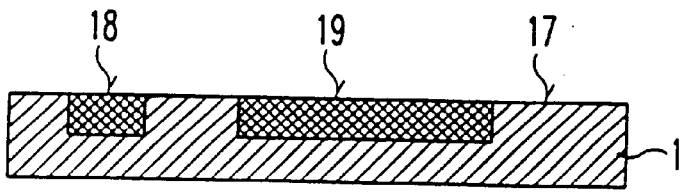
Figure 3A:
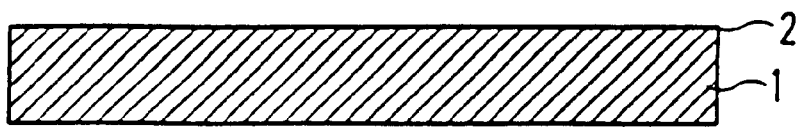
FIGS. 3a–3e are sectional views of the sequence of the process steps which occur in a second exemplary embodiment of the method.
Figure 3B:
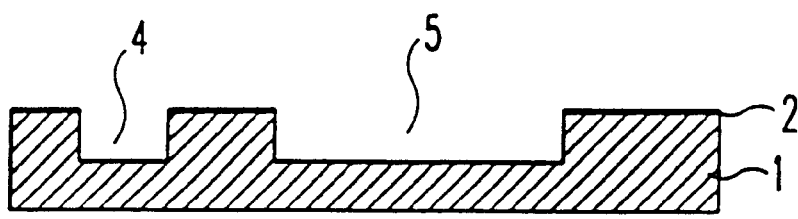
Figure 3C:
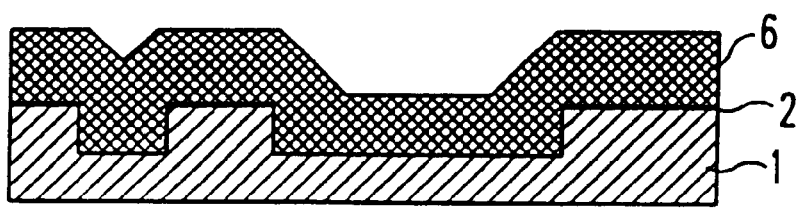
Figure 3D:
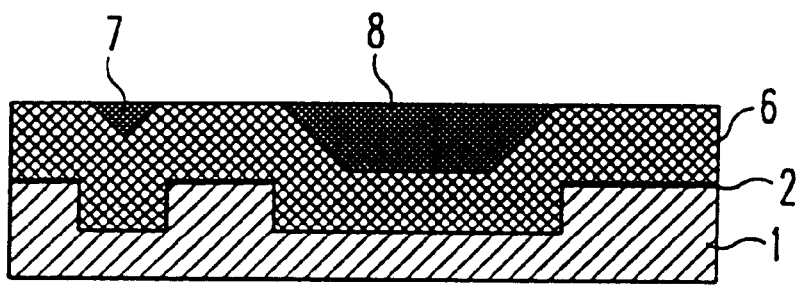
Figure 3E:
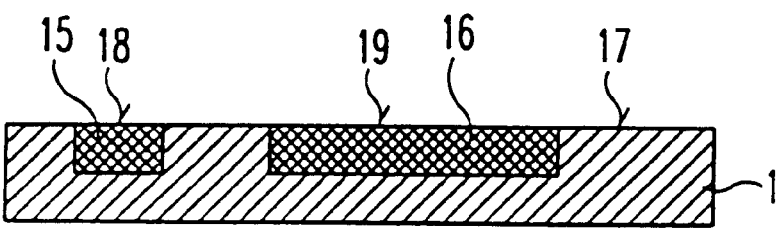

A subsequent removal of the nitride layer 3, which can also be effected actually before the selective etching step depending on variants described above, yields the trench profile of the substrate 1 with an altogether planar substrate surface as shown in FIG. 2f.

FIGS. 3a–3e show process steps of a second exemplary embodiment of the method according to the invention. As was also the case with the first exemplary embodiment as shown in FIGS. 2a–2f, cleaning and preparatory steps and also any further additional measures have not been included in the illustration. The second exemplary embodiment differs from the first exemplary embodiment essentially merely by the fact that the nitride layer 3 is dispensed with. This is possible because the stopping function—necessary in the known method according to FIGS. 1a–1f—of the nitride layer 3 with regard to the oxide polishing process (FIG. 1f) is not required in the nonselective plasma etching step (FIG. 2e and FIG. 3e) provided according the invention.

The second exemplary embodiment affords the advantages that, because the nitride layer 3 has been dispensed with, the layer deposition and the layer removal steps that are necessary for it can be omitted and an aspect ratio (ratio of trench depth to trench width) in the trench etching process can be reduced and the required TEOS oxide layer thickness can be reduced. The last-mentioned advantages can also be achieved in the first exemplary embodiments with the nitride layer 3, if the thickness of the nitride layer 3 is reduced in a suitable manner.

Table 1 indicates typical values for the selectivities (S) and surface uniformities (UF) achieved in the polishing method (poly-CMP) and in the nonselective plasma etching method.

TABLE 1

|  | UF: Oxide removal | UF: Poly removal | UF: Nitride removal | S: Oxide: Poly | S: Oxide: Nitride |
|---|---|---|---|---|---|
| Plasma etching | 3.40% | 1.43% | 1.36% | 1.04 | 0.99 |
| Poly-CMP | 5.00% | 2.50% | 5.00% | 0.01 | 4.00 |

The values make it clear that the nonselective plasma etching method yields better uniformity of the processed surfaces compared with the poly-CMP method and, consequently, do not impair the uniformity achieved in the poly-CMP method. The values for the selectivities are approximately 1 in the case of the nonselective plasma etching method and are entirely sufficient for uniform layer removal with the evenness being preserved.

Figure 4:
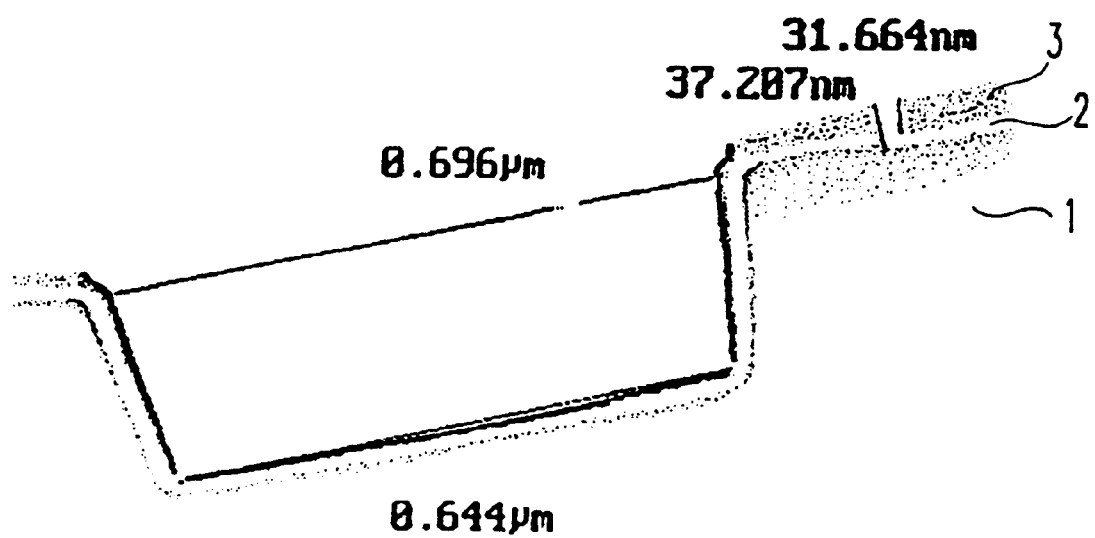
FIG. 4 is a scanning electron microscope photograph of a trench profile formed according to the invention, after selective oxide wet etching.

FIG. 4 shows a scanning electron microscope cross-sectional photograph of a trench in the substrate 1 with the thin thermal oxide layer 2 and the CVD nitride layer 3 after the nonselective oxide-polysilicon plasma etching according to the invention. The total thickness of the two layers is approximately 37 nm, the thickness of the nitride layer being approximately 32 nm. After the nonselective etching step according to the invention, the substrate was exposed to the selective oxide wet etching already described, as a result of which the surface level of the trench oxide was lowered to below the surface level of the nitride layer 3 covering the substrate. Accordingly, the trench depth is 696 nm, while the distance between trench body and surface of the trench oxide is 644 nm.

We claim:

1. A method for forming a trench structure in a silicon substrate, the trench structure electrically insulating a first region of the silicon substrate from a second region of the silicon substrate, the method which comprises:

growing a thermal oxide layer on a surface of the silicon substrate;

applying and patterning a mask layer over the thermal oxide layer resulting in a patterned mask layer;

etching a trench using the patterned mask layer down to a predetermined depth into the silicon substrate;

depositing a substantially conformal covering oxide layer with a substantially uniform thickness that is sufficient for completely filling the trench;

depositing a polysilicon layer on the conformal covering oxide layer, a thickness of the polysilicon layer corresponding at least the predetermined depth of the trench;

chemical mechanical polishing of the polysilicon layer as far as a level of a surface of the conformal covering oxide layer with high selectivity between a polysilicon material of the polysilicon layer and an oxide material of the conformal covering oxide layer; and substantially nonselective, joint etching of the polysilicon material of the polysilicon layer and of the oxide material of the covering oxide layer while maintaining a planar surface produced in accordance with the chemical mechanical polishing step, the substantially nonselective etching step being carried out at least until all the polysilicon material of the polysilicon layer being removed in a region of the trench.

2. The method according to claim 1, which comprises performing the substantially nonselective, joint etching step as a plasma etching step including reactive ion etching (RIE).

3. The method according to claim 1, which comprises using $NF_3/N_2/CHF_3$ gases as etching gases in the substantially nonselective, joint etching step.

4. The method according to claim 1, which comprises depositing the thickness of the conformal covering oxide layer to be larger than a trench depth and the substantially nonselective, joint etching step is continued after the removal of all the polysilicon material of the polysilicon layer until a remaining part of the conformal covering oxide layer has a predetermined thickness above an unetched substrate surface.

5. The method according to claim 1, which comprises applying a silicon nitride layer to the thermal oxide layer after the growing step.

6. The method according to claim 1, which comprises performing the substantially nonselective, joint etching step to have a selectivity between the oxide and the polysilicon material in a range of from 0.95 to 1.05.

7. The method according to claim 1, which comprises carrying out a selective wet etching step in order to remove the oxide material after the nonselective, etching step.

8. The method according to claim 7, which comprises controlling the selective wet etching step such that a predetermined distance can be set between a surface of the oxide material in the trench and the surface of the silicon substrate.

9. The method according to claim 1, which comprises epitaxially growing a thin oxide support conformally on the silicon substrate between the step of etching the trench and the step of depositing the conformal covering oxide layer.

10. The method according claim 1, which comprises depositing the conformal covering oxide layer by a TEOS vapor phase deposition step.

* * * * *